US 010734309B2

(12) United States Patent
Kim et al.

(10) Patent No.: US 10,734,309 B2
(45) Date of Patent: Aug. 4, 2020

(54) SEMICONDUCTOR DEVICE HAVING A TRENCH WITH A CONVEXED SHAPED METAL WIRE FORMED THEREIN

(71) Applicant: Samsung Electronics Co., Ltd., Suwon-si, Gyeonggi-do (KR)

(72) Inventors: Jin-Nam Kim, Anyang-si (KR); Tsukasa Matsuda, Seongnam-si (KR); Rak-Hwan Kim, Suwon-si (KR); Byung-Hee Kim, Seoul (KR); Nae-In Lee, Seoul (KR); Jong-Jin Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/282,682

(22) Filed: Feb. 22, 2019

(65) Prior Publication Data

US 2019/0189540 A1    Jun. 20, 2019

Related U.S. Application Data

(63) Continuation of application No. 15/669,280, filed on Aug. 4, 2017, now abandoned, which is a (Continued)

(30) Foreign Application Priority Data

Nov. 3, 2014    (KR) .......................... 10-2014-0151278

(51) Int. Cl.
*H01L 23/48* (2006.01)
*H01L 23/485* (2006.01)
(Continued)

(52) U.S. Cl.
CPC ........ *H01L 23/485* (2013.01); *H01L 21/7684* (2013.01); *H01L 21/76846* (2013.01);
(Continued)

(58) Field of Classification Search
None
See application file for complete search history.

(56) References Cited

U.S. PATENT DOCUMENTS 6,353,266 B1    3/2002    Okamura
6,495,452 B1    12/2002    Shih
(Continued)

FOREIGN PATENT DOCUMENTS

KR    1020020051350    6/2002
KR    1020050068868    7/2005
(Continued)

*Primary Examiner* — Hung K Vu
(74) *Attorney, Agent, or Firm* — Myers Bigel, P.A.

(57) ABSTRACT

A semiconductor device and a method of fabricating the same are provided. The semiconductor device includes a first interlayer insulating layer including a first trench, on a substrate a first liner layer formed along a side wall and a bottom surface of the first trench and including noble metal, the noble metal belonging to one of a fifth period and a sixth period of a periodic chart that follows numbering of International Union of Pure and Applied Chemistry (IUPAC) and belonging to one of eighth to tenth groups of the periodic chart, and a first metal wire filling the first trench on the first liner layer, a top surface of the first metal wire having a convex shape toward a bottom surface of the first trench.

19 Claims, 17 Drawing Sheets

Related U.S. Application Data continuation of application No. 14/924,217, filed on Oct. 27, 2015, now abandoned.

(51) Int. Cl.
*H01L 21/768* (2006.01)
*H01L 23/498* (2006.01)
*H01L 23/522* (2006.01)
*H01L 23/532* (2006.01)

(52) U.S. Cl.
CPC .. *H01L 21/76849* (2013.01); *H01L 21/76882* (2013.01); *H01L 23/49822* (2013.01); *H01L 23/49866* (2013.01); *H01L 23/5226* (2013.01); *H01L 23/5329* (2013.01); *H01L 23/53209* (2013.01); *H01L 23/53223* (2013.01); *H01L 23/53238* (2013.01); *H01L 23/53266* (2013.01); *H01L 23/53276* (2013.01); *H01L 23/53295* (2013.01); *H01L 2924/0002* (2013.01)

(56) References Cited

U.S. PATENT DOCUMENTS

| | | | |
|---|---|---|---|
| 7,179,759 B2 | 2/2007 | Huang | |
| 7,402,883 B2 | 7/2008 | Yang | |
| 7,585,765 B2 | 9/2009 | Yang | |
| 7,790,617 B2 | 9/2010 | Lim | |
| 8,039,966 B2 | 10/2011 | Yang | |
| 8,247,030 B2 * | 8/2012 | Suzuki | H01L 21/76843 427/248.1 |
| 8,399,353 B2 | 3/2013 | Ishizaka | |
| 8,592,306 B2 | 11/2013 | Yang | |
| 2002/0151190 A1 * | 10/2002 | Kudo | H01L 21/76802 438/780 |
| 2003/0003733 A1 * | 1/2003 | Ohashi | H01L 21/76819 438/689 |
| 2003/0054649 A1 | 3/2003 | Wu | |
| 2007/0007653 A1 | 1/2007 | Chen | |
| 2010/0237501 A1 | 9/2010 | Tomizawa | |
| 2011/0009033 A1 | 1/2011 | Tanaka | |
| 2012/0315754 A1 * | 12/2012 | Zhu | H01L 21/7684 438/653 |
| 2014/0030886 A1 | 1/2014 | Fukushima | |

FOREIGN PATENT DOCUMENTS

| | | |
|---|---|---|
| KR | 1020060075339 | 7/2006 |
| KR | 1020080001905 | 1/2008 |
| KR | 1020090056685 | 6/2009 |

* cited by examiner

US 10,734,309 B2

SEMICONDUCTOR DEVICE HAVING A TRENCH WITH A CONVEXED SHAPED METAL WIRE FORMED THEREIN

CROSS-REFERENCE TO RELATED APPLICATION

This application is a continuation of U.S. patent application Ser. No. 15/669,280, filed Aug. 4, 2017, which application is a continuation of U.S. patent application Ser. No. 14/924,217, filed Oct. 27, 2015, which itself claims priority from Korean Patent Application No. 10-2014-0151278 filed on Nov. 3, 2014 in the Korean Intellectual Property Office, and all the benefits accruing therefrom under 35 U.S.C. 119, the contents of which in their entireties are herein incorporated by reference.

TECHNICAL FIELD

The present inventive concept relates to a semiconductor device and a method of fabricating the same, and, more particularly, to a semiconductor device including a copper wire and a method of fabricating the same.

BACKGROUND

With development of electronic technology, and as downscaling of a semiconductor device has rapidly progressed in recent years, high-integration and low-power of a semiconductor chip have been required.

To meet the high-integration and lower power goals, semiconductor devices have been fabricated with improvements in wire resistance and electromigration resistance. Copper, which is relatively high in conductivity and high in resistance to electromigration, may be used as a wire material.

SUMMARY

Embodiments according to the present inventive concept may provide a semiconductor device of which reliability can be enhanced by improving electromigration resistance of a metal wire through controlling the top shape of the metal wire.

Embodiments according to the present inventive concept may also provide a method of fabricating a semiconductor device of which reliability can be enhanced by improving electromigration resistance of a metal wire through controlling the top shape of the metal wire.

According to an aspect of the present inventive concept, there is provided a semiconductor device comprising a first interlayer insulating layer including a first trench, on a substrate a first liner layer formed along a side wall and a bottom surface of the first trench and including noble metal, the noble metal belonging to one of a fifth period and a sixth period of a periodic chart that follows numbering of International Union of Pure and Applied Chemistry (IUPAC) and belonging to one of eighth to tenth groups of the periodic chart, and a first metal wire filling the first trench on the first liner layer, a top surface of the first metal wire having a convex shape toward a bottom surface of the first trench.

In some embodiments of the present inventive concept, at a point where the first liner layer and the top surface of the first metal wire are adjacent to each other, an uppermost surface of the first liner layer and the top surface of the first metal wire are continuous.

In some embodiments of the present inventive concept, at the point where the first liner layer and the top surface of the first metal wire are adjacent to each other, no step is formed between the uppermost surface of the first liner layer and the top surface of the first metal wire.

In some embodiments of the present inventive concept, the uppermost surface of the first liner layer and the top surface of the first metal wire directly contact each other.

In some embodiments of the present inventive concept, the top surface of the first metal wire does not protrude above the uppermost surface of the first liner layer on the whole.

In some embodiments of the present inventive concept, the top surface of the first metal wire comprises a first point and a second point, a distance up to the first point from a point where the top surface of the first metal wire and the uppermost surface of the first liner layer meet is less than a distance up to the second point from the point where the top surface of the first metal wire and the uppermost surface of the first liner layer meet, and a depth up to the first point from the uppermost surface of the first liner layer is less than a depth up to the second point from the uppermost surface of the first liner layer.

In some embodiments of the present inventive concept, the noble metal comprises at least one of ruthenium (Ru), platinum (Pt), iridium (Ir), and rhodium (Rh).

In some embodiments of the present inventive concept, the first liner layer is conformally formed along the side wall and the bottom surface of the first trench.

In some embodiments of the present inventive concept, a thickness of the first liner layer formed on the bottom surface of the first trench is greater than the thickness of the first liner layer formed on the side wall of the first trench.

In some embodiments of the present inventive concept, the first liner layer formed on the side wall of the first trench has an overhang structure, at a portion where the top surface of the first metal wire and the uppermost surface of the first liner layer meet.

In some embodiments of the present inventive concept, the semiconductor device may further comprise a capping layer formed on the top surface of the first metal wire.

In some embodiments of the present inventive concept, the capping layer directly contacts the first liner layer and the first metal wire.

In some embodiments of the present inventive concept, the capping layer covers the top surface of the first metal wire.

In some embodiments of the present inventive concept, the capping layer extends onto the uppermost surface of the first liner layer.

In some embodiments of the present inventive concept, the capping layer does not extend on the top surface of the first interlayer insulating layer.

In some embodiments of the present inventive concept, the capping layer includes a portion that protrudes above the uppermost surface of the first liner layer.

In some embodiments of the present inventive concept, the capping layer comprises at least one of cobalt (Co), ruthenium (Ru), and manganese (Mn).

In some embodiments of the present inventive concept, the semiconductor device may further comprise a first barrier layer formed along the side wall and the bottom surface of the first trench, between the first interlayer insulating layer and the first liner layer.

In some embodiments of the present inventive concept, the semiconductor device may further comprise a capping layer formed on the top surface of the first metal wire. The capping layer extends onto the uppermost surface of the first barrier layer.

In some embodiments of the present inventive concept, the first metal wire comprises copper (Cu).

In some embodiments of the present inventive concept, the semiconductor device may further comprise a second interlayer insulating layer comprising a second trench, on the first interlayer insulating layer, a second liner layer formed along a side wall and a bottom surface of the second trench and including the noble metal, and a second metal wire filling the second trench and electrically connected with the first metal wire. A top surface of the second metal wire has a convex shape toward the bottom surface of the second trench.

In some embodiments of the present inventive concept, the semiconductor device may further comprise a second barrier layer formed along the side wall and the bottom surface of the second trench, between the second interlayer insulating layer and the second liner layer.

In some embodiments of the present inventive concept, the second barrier layer formed on the bottom surface of the second trench is formed along a profile of the top surface of the first metal wire.

In some embodiments of the present inventive concept, the second barrier layer directly contacts the first metal wire.

In some embodiments of the present inventive concept, the semiconductor device may further comprise a capping layer formed on the top surface of the first metal wire. The capping layer is disposed between the top surface of the first metal wire and the second liner layer formed on the bottom surface of the second trench.

According to another aspect of the present inventive concept, there is provided a semiconductor device comprising an interlayer insulating layer including a trench, on a substrate, a first liner layer formed along a side wall and a bottom surface of the trench, a metal wire filling the trench and comprising copper (Cu), on the first liner layer, a top surface of the metal wire having a convex shape toward the bottom surface of the trench, and a second liner layer including a first part formed along the side wall and the bottom surface of the metal wire and a second part formed along the top surface of the metal wire, the second liner and covering the metal wire, wherein any one of the first liner layer and the second liner layer comprises a noble metal that belongs to one of a fifth period and a sixth period of a periodic chart that follows numbering of International Union of Pure and Applied Chemistry (IUPA) and belongs to one of eighth to tenth groups of the periodic chart.

In some embodiments of the present inventive concept, the first part of the second liner layer is disposed between the first liner layer and the metal wire, and the noble metal is in the first part of the second liner layer.

In some embodiments of the present inventive concept, the first part of the second liner layer directly contacts the metal wire, and no step is formed between an uppermost surface of the first part of the second liner layer and the top surface of the metal wire.

In some embodiments of the present inventive concept, the second part of the liner layer does not extend onto an uppermost surface of the first liner layer.

In some embodiments of the present inventive concept, the first liner layer is disposed between the first part of the second liner layer and the metal wire, and the noble metal is in the first liner layer.

In some embodiments of the present inventive concept, the first liner layer and the metal wire directly contact each other, and no step is formed between the uppermost surface of the first liner layer and the top surface of the metal wire.

In some embodiments of the present inventive concept, the second part of the liner layer does not extend onto a top surface of the interlayer insulating layer.

In some embodiments of the present inventive concept, the second part of the second liner layer comprises at least one of cobalt (Co), ruthenium (Ru), and manganese (Mn).

According to still another aspect of the present inventive concept, there is provided a semiconductor device comprising an interlayer insulating layer comprising a trench, on a substrate, a barrier layer formed along a side wall and a bottom surface of the trench, a ruthenium (Ru) liner layer formed along the side wall and the bottom surface of the trench, on the barrier layer, a metal wire filling the trench and comprising copper, on the ruthenium liner layer, a top surface of the metal wire having a convex shape toward the bottom surface of the trench and being continuous with an uppermost surface of the ruthenium liner layer, and a capping layer formed along the top surface of the metal wire.

In some embodiments of the present inventive concept, the metal wire directly contacts the liner layer, and no step is formed between the uppermost surface of the liner layer and the top surface of the metal wire.

In some embodiments of the present inventive concept, the capping layer is a cobalt (Co) layer.

In some embodiments of the present inventive concept, the barrier layer comprises tantalum (Ta).

In some embodiments of the present inventive concept, the capping layer does not extend on a top surface of the interlayer insulating layer.

In some embodiments of the present inventive concept, the interlayer insulating layer comprises a low-dielectric material having a lower dielectric constant than silicon oxide.

According to still another aspect of the present inventive concept, there is provided a semiconductor device comprising an interlayer insulating layer including a trench, on a substrate, a barrier layer formed along a side wall and a bottom surface of the trench, a liner layer formed along the side wall and the bottom surface of the trench, on the barrier layer; and a metal wire filling the trench and comprising copper, on the liner layer, a top surface of the metal wire being a curved surface, and being continuous with an uppermost surface of the liner layer, and not protruding above a top surface of the interlayer insulating layer, wherein a wetting angle having copper in a reflow state on the liner layer is a first angle, and the wetting angle having the copper in the reflow state on the barrier layer is a second angle, and the second angle is greater than the first angle.

In some embodiments of the present inventive concept, the first angle is an acute angle and the second angle is an obtuse angle.

In some embodiments of the present inventive concept, the liner layer includes metal that belongs to one of a fifth period and a sixth period of a periodic chart that follows numbering of International Union of Pure and Applied Chemistry (IUPAC) and belongs to one of eighth to tenth groups of the periodic chart.

In some embodiments of the present inventive concept, the liner layer comprises at least one of ruthenium (Ru), platinum (Pt), iridium (Ir), and rhodium (Rh).

In some embodiments of the present inventive concept, the barrier layer comprises at least one of tantalum (Ta) and titanium (Ti).

According to still another aspect of the present inventive concept, there is provided a semiconductor device comprising a metal wire extending in one direction on a substrate, a top surface of the metal wire having a half-pipe shape, a ruthenium liner layer formed along a side wall and a bottom surface of the metal wire, a capping layer formed along the top surface of the metal wire, a via formed on the metal wire, and a barrier layer disposed between a bottom surface of the via and the top surface of the metal wire.

In some embodiments of the present inventive concept, the barrier layer directly contacts the capping layer.

In some embodiments of the present inventive concept, the capping layer comprises an opening that exposes the top surface of the metal wire, and the barrier layer directly contacts the metal wire through the opening.

According to still another aspect of the present inventive concept, there is provided a method of fabricating a semiconductor device comprising forming an interlayer insulating layer including a trench, forming a prebarrier layer and a preliner layer comprising ruthenium sequentially along a side wall and a bottom surface of the trench, and a top surface of the interlayer insulating layer, forming a metal layer filling the trench and covering the top surface of the interlayer insulating layer, on the preliner layer, forming a metal wire in the trench by exposing the top surface of the interlayer insulating layer by using a planarization process, and forming a capping layer on a top surface of the metal wire, wherein the top surface of the metal wire has a convex shape toward the bottom surface of the trench.

In some embodiments of the present inventive concept, the preliner layer is formed by using chemical vapor deposition.

In some embodiments of the present inventive concept, the capping layer is formed by selectively depositing a layer on the top surface of the metal wire, and the capping layer does not extend onto a top surface of the interlayer insulating layer.

In some embodiments of the present inventive concept, the forming of the metal layer comprises forming a pre-metal layer on the top surface of the interlayer insulating layer and in the trench, and reflowing the pre-metal layer.

In some embodiments of the present inventive concept, the metal layer is formed by using an electroplating method.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

The above and other features and advantages of the present inventive concept will become more apparent by describing in detail embodiments thereof with reference to the attached drawings in which.

DETAILED DESCRIPTION OF THE EMBODIMENTS

Figure 1:
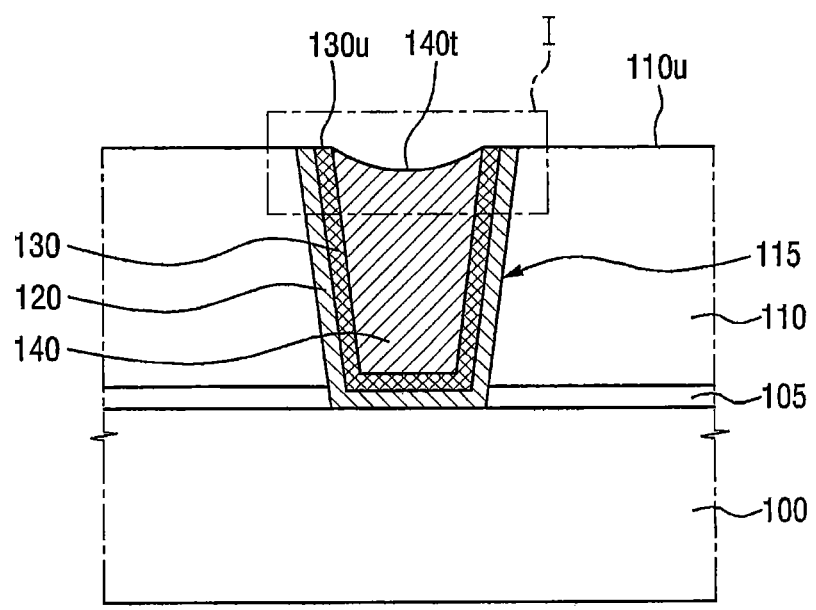
FIG. 1 is a diagram for illustrating a semiconductor device according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include mean to targets in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to an embodiment of the present inventive concept will be described with reference to FIGS. 1 to 3B.

Figure 2:
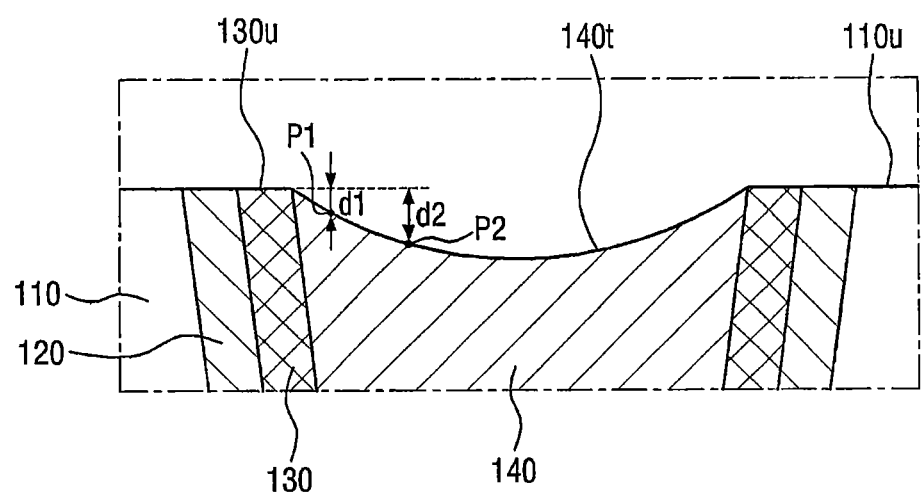
FIG. 2 is an enlarged diagram of part I of FIG. 1.
Figure 3A:
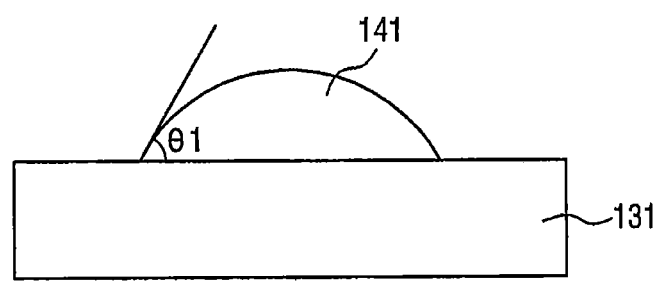
FIGS. 3A and 3B are diagrams for illustrating a wetting angle of copper in a reflow state on a contact substrate.
Figure 3B:
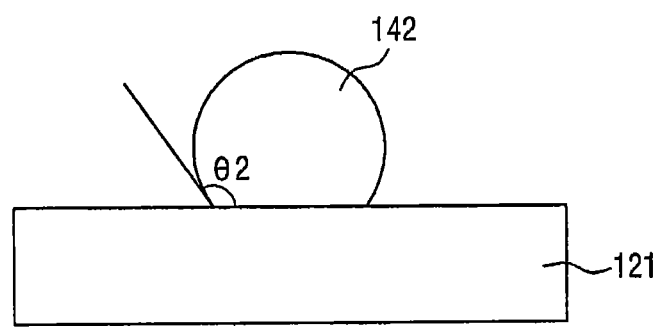

FIG. 1 is a diagram for illustrating a semiconductor device according to some embodiments of the present inventive concept. FIG. 2 is an enlarged diagram of part I of FIG. 1. FIGS. 3A and 3B are diagrams for illustrating a wetting angle of copper in a reflow state on a contact substrate.

For reference, FIG. 3A illustrates a wetting angle of copper in a reflow state on a contact substrate made of a material included in a first liner layer, and FIG. 3B illustrates the wetting angle of copper in the reflow state on a contact substrate made of a material included in a first barrier layer.

Referring to FIGS. 1 and 2, a semiconductor device 1 according to some embodiments of the present inventive concept may include a first interlayer insulating layer 110, a first barrier layer 120, a first liner layer 130, a first metal wire 140, and the like.

The first interlayer insulating layer 110 may be formed on a substrate 100. The first interlayer insulating layer 110 may include a first trench 115 formed in the first interlayer insulating layer 110.

A first etch stop layer 105 may be further included between the first interlayer insulating layer 110 and the substrate 100. The first trench 115 included in the first interlayer insulating layer 110 may extend up to the first etch stop layer 105.

The substrate 100 may be a structure in which a base substrate and an epitaxial layer are laminated, but is not limited thereto. The substrate 100 may be a silicon substrate, a gallium-arsenic substrate, a silicon germanium substrate, a ceramic substrate, a quartz substrate, or a display glass substrate or a semiconductor on insulator (SOI) substrate. Hereinafter, the silicon substrate will be described as an example. Alternatively, the substrate 100 may have a form in which an insulating layer is formed on the silicon substrate.

Although not illustrated, the substrate 100 may include a conductive pattern. The conductive pattern may be a metal wire or a contact or may also be a gate electrode of a transistor, a source/drain of the transistor, or a diode, but is not limited thereto.

The first etch stop layer 105 is formed on the substrate 100. The first etch stop player 105 may include, for example, silicon nitride, silicon oxynitride, silicon carbon nitride, and the like.

The first interlayer insulating layer 110 may include, for example, at least one of silicon oxide, silicon nitride, silicon oxynitride, and a low dielectric material. The first interlayer insulating layer 110 may include the low-dielectric material to reduce a coupling phenomenon between the wires.

The low dielectric material may include, for example, flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or combinations thereof, but is not limited thereto.

The first barrier layer 120 may be formed along a side wall and a bottom surface of the first trench 115. The first barrier layer 120 may prevent or reduce the likelihood of an element included in the first metal wire 140 from being diffused to the first interlayer insulating layer 110 or prevent or reduce the likelihood of oxygen included in the first interlayer insulating layer 110 from being diffused to the first liner layer 130 and the first metal wire 140.

The first barrier layer 120 may include one of, for example, titanium (Ti), titanium nitride (TiN), tantalum (Ta), tantalum nitride (TaN), tantalum carbon nitride (TaCN), tungsten (W), tungsten nitride (WN), tungsten carbon nitride (WCN), zirconium (Zr), zirconium nitride (ZrN), vanadium (V), vanadium nitride (VN), niobium (Nb), niobium nitride (NbN), and combinations thereof.

In the following description, the first barrier layer 120 includes tantalum (Ta), but is not limited thereto.

The first liner layer 130 may be formed on the side wall and the bottom surface of the first trench 115. The first liner layer 130 may be formed on the first barrier layer 120. That is, the first barrier layer 120 may be formed between the first liner layer 130 and the first interlayer insulating layer 110.

In the semiconductor device 1 according to some embodiments of the present inventive concept, the first liner layer 130 may be conformally formed on the side wall and the bottom surface of the first trench 115.

The first liner layer 130 may include a material that has stronger resistance to a chemical material than the first metal wire 140. In more detail, the first liner layer 130 may include a material that has stronger chemical resistance to slurry used in a CMP process than the first metal wire 140.

The first liner layer 130 may include a noble metal that has resistance to corrosion and oxidation under a humid environment. For example, the first liner layer 130 belongs to an eighth group to a tenth group, in a periodic chart that follows IUPAC numbering of International Union of Pure and Applied Chemistry (IUPAC) and may be noble metal that belongs to a fifth period and/or a sixth period.

In detail, the first liner layer 130 may include, for example, at least one of ruthenium (Ru), platinum (Pt), iridium (Ir), and a rhodium (Rh). That is, the noble metal may include, for example, at least one of ruthenium (Ru), platinum (Pt), iridium (Ir), and a rhodium (Rh).

In the following description, the first liner layer 130 is described as including ruthenium (Ru), but is not limited thereto.

The first metal wire 140 may be formed by filling the first trench 115. The first metal wire 140 may be formed on the first liner layer 130. The first metal wire 140 may be electrically connected with the conductive pattern, which may be included in the substrate 100.

The first metal wire 140 may include copper (Cu), which is high in conductivity and high in electromigration resistance. Further, the copper included in the first metal wire 140 may include, for example, carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), magnesium (Mg), aluminum (Al), or zirconium (Zr).

In the semiconductor device according to some embodiments of the present inventive concept, a top surface 140t of the first metal wire 140 may be a curved surface having a convex shape toward the bottom surface of the first trench 115. The top surface 140t of the first metal wire 140 may be concave from a top surface 110u of the first interlayer insulating layer 110.

In more detail, the top surface 140t of the first metal wire 140 may include a first point P1 and a second point P2. A distance up to the first point P1 from a point at which the top surface 140t of the first metal wire 140 and an uppermost surface 130u of the first liner layer 130 meet may be smaller than a distance up to the second point P2 from the point at which the top surface 140t of the first metal wire 140 and the uppermost surface 130u of the first liner layer 130 meet.

In this case, a first depth d1 up to the first point P1 from the uppermost surface 130u of the first liner layer 130 is smaller than a second depth d2 up to the second point P2 from the uppermost surface 130u of the first liner layer 130.

In other words, the center of the top surface 140t of the first metal wire 140 is most recessed based on the uppermost surface 130u of the first liner layer 130 and the top surface 140t of the first metal wire 140 adjacent to the uppermost surface 130u of the first liner layer 130 may not be recessed based on the uppermost surface 130u of the first liner layer 130.

In the semiconductor device according to some embodiments of the present inventive concept, the uppermost surface 130u of the first liner layer and the top surface 140t of the first metal wire 140 may be continuous at a point where the first liner layer 130 and the top surface 140t of the first metal wire 140 are adjacent to each other.

In other words, a step may not be formed between the uppermost surface 130u of the first liner layer and the top surface 140t of the first metal wire 140, at the point where the first liner layer 130 and the top surface 140t of the first metal wire 140 are adjacent to each other.

Accordingly, the uppermost surface 130u of the first liner layer and the top surface 140t of the first metal wire 140 may directly contact each other, at the point where the first liner layer 130 and the first metal wire 140 are adjacent to each other.

The top surface 140t of the first metal wire 140 has a convex shape toward the bottom surface of the first trench 115. And, the step is not formed between the uppermost surface 130u of the first liner layer 130 and the top surface 140t of the first metal wire 140. So, the top surface 140t of the first metal wire 140 may not entirely protrude above the uppermost surface 130u of the first liner layer 130.

Referring to FIGS. 3A and 3B, when the copper (Cu) included in the first metal wire 140 is in the reflow state, a wetting angle or a contact angle depending on types of contact substrates 121 and 131 will be described.

The first contact substrate 131 of FIG. 3A may be a substrate made of a noble metal included in the first liner layer 130 and the second contact substrate 121 of FIG. 3B may be a substrate made of a material included in the first barrier layer 120.

Wetting shows a tendency of a material in a fluid state, which covers a solid surface. Wettability is determined by a balance between adhesive force between solid and fluid, which allows the fluid to be evenly diffused, and cohesive force in the fluid.

That is, when the adhesive force between the solid and the fluid is larger than the cohesive force in the fluid, the fluid covers the surface of the solid well. Therefore, a wetting characteristic of the fluid to the solid may be improved.

On the contrary, when the adhesive force between the solid and the fluid is smaller than the cohesive force in the fluid, the fluid does not well cover the surface of the solid. Therefore, the wetting characteristic of the fluid to the solid may deteriorate.

In FIG. 3A, when first reflow copper 141 in the reflow state is positioned on the first contact substrate 131, the first reflow copper 141 has a first wetting angle θ1.

In FIG. 3B, when second reflow copper 142 in the reflow state is positioned on the second contact substrate 121, the second reflow copper 142 has a second wetting angle θ2. In this case, the first reflow copper 141 and the second reflow copper 142 are substantially the same as each other in other conditions except for the contact substrate.

In FIGS. 3A and 3B, the first wetting angle θ1 is smaller than the second wetting angle θ2. For example, the first wetting angle θ1 may be an acute angle smaller than 90 degrees and the second wetting angle θ2 may be an obtuse angle larger than 90 degrees.

That is, the copper in the reflow state is better wetted to the first contact substrate 131 made of the material included in the first liner layer 130 than the second contact substrate 121 made of the material included in the first barrier layer 120.

As the wetting characteristic is better, the fluid may be well diffused on the surface of the solid. That is, during a fabrication process, when the copper is in the reflow state having flexibility, the copper is better diffused on the first liner layer 130 than the first barrier layer 120.

If the first metal wire 140 is fabricated by using the reflow state in which the copper has the flexibility, when the copper in the reflow state is formed on the first liner layer 130 rather than on the first barrier layer 120, the copper in the reflow state may be better diffused. Accordingly, when the first metal wire 140 is formed by using the reflow process, the first metal wire 140 may be fabricated more easily on the first liner layer 130 than on the first barrier layer 120.

A semiconductor device according to other embodiments of the present inventive concept will be described with reference to FIGS. 4 and 5. For easy description, a part duplicated with the embodiment described by using FIGS. 1 and 2 will be described in brief or omitted.

Figure 4:
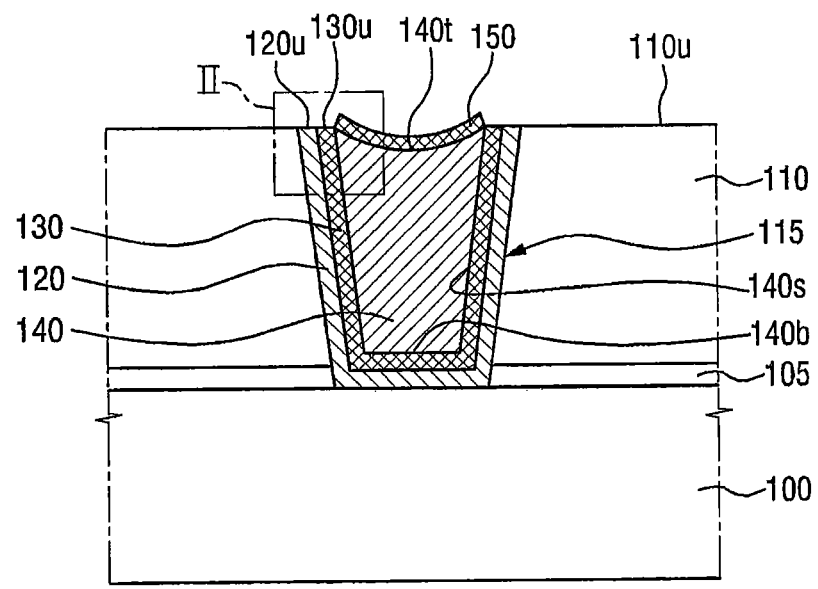
FIG. 4 is a diagram for illustrating a semiconductor device according to other embodiments of the present inventive concept.

FIG. 4 is a diagram for illustrating a semiconductor device according to other embodiments of the present inventive concept. FIG. 5 is an enlarged diagram of part II of FIG. 4.

Figure 5:
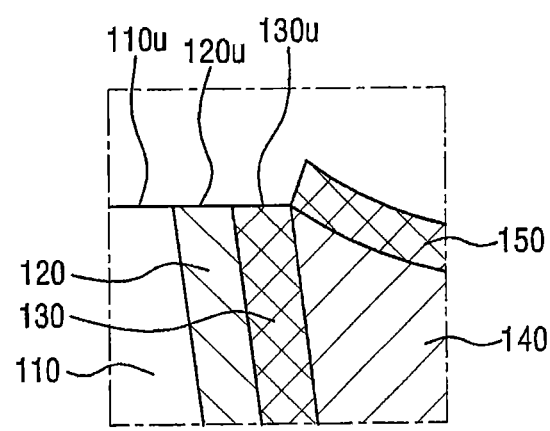
FIG. 5 is an enlarged diagram of part II of FIG. 4.

Referring to FIGS. 4 and 5, the semiconductor device 2 according to other embodiments of the present inventive concept may further include a first capping layer 150.

The first capping layer 150 may be formed on the top surface 140t of the first metal wire 140. The first capping layer 150 may be formed along the top surface 140t of the first metal wire 140.

The first capping layer 150 may directly contact the first metal wire 140 and the first liner layer 130. The first capping layer 150 may cover the top surface 140t of the first metal wire 140 on the whole.

In the semiconductor device 2 according to other embodiments of the present inventive concept, the first capping layer 150 is formed only on the top surface 140t of the first metal wire 140 and may not extend onto the uppermost surface 130u of the first liner layer 130. Further, the first capping layer 150 may not extend onto an uppermost surface 120u of the first barrier layer and an uppermost surface of the first interlayer insulating layer 110.

In FIG. 5, the top surface 140t of the first metal wire 140 and the uppermost surface 130u of the first liner layer 130 do not directly contact each other, and no step is formed between the top surface 140t of the first metal wire 140 and the uppermost surface 130u of the first liner layer 130. A part of the first capping layer 150 formed on the top surface 140t of the first metal wire 140 may protrude above the uppermost surface 130u of the first liner layer 130, but is not limited thereto.

The first capping layer 150 may be formed along the top surface 140t of the first metal wire 140, and the first liner layer 130 may be formed along a side wall 140s and a bottom surface 140b of the first metal wire 140. That is, the first capping layer 150 and the first liner layer 130 may cover the first metal wire 140 on the whole.

The first capping layer 150 may include a material that may prevent or reduce the electromigration, which may occur along the top surface 140t of the first metal wire when current flows on the first metal wire 140. The first capping layer 150 may include, for example, at least one of cobalt (Co), ruthenium (Ru), and manganese (Mn).

A semiconductor device according to yet other embodiments of the present inventive concept will be described with reference to FIG. 6. For easy description, a part that is duplicated with the embodiments described with reference to FIGS. 4 and 5 will be described in brief or omitted.

Figure 6:
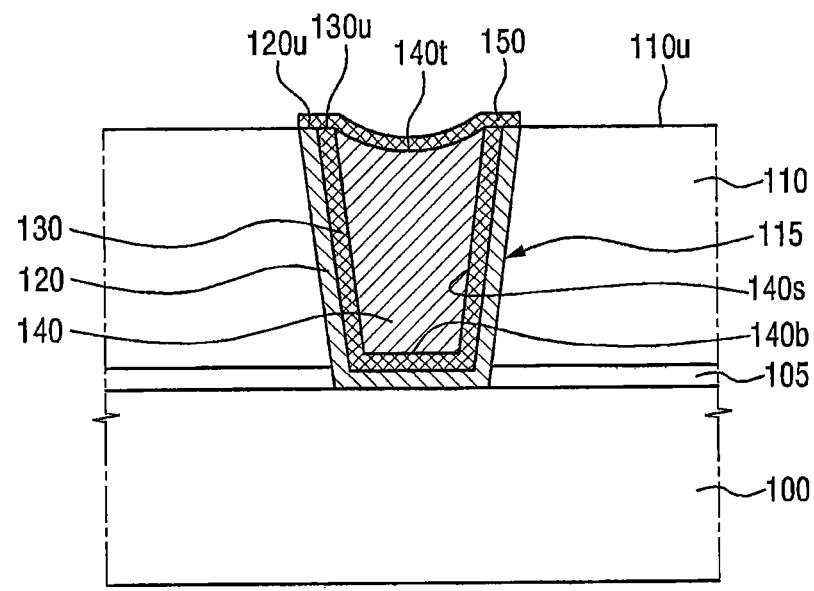
FIG. 6 is a diagram for illustrating a semiconductor device according to further embodiments of the present inventive concept.

FIG. 6 is a diagram for illustrating a semiconductor device according to yet other embodiments of the present inventive concept.

Referring to FIG. 6, in a semiconductor device 3 according to yet other embodiments of the present inventive concept, the first capping layer 150 may extend onto the uppermost surface 130u of the first liner layer and the uppermost surface 120u of the first barrier layer.

However, the first capping layer 150 does not extend onto the top surface 110u of the first interlayer insulating layer 110. The reason is that a method of selectively forming a layer on a conductive material is used for the first capping layer 150.

In the semiconductor device 3 according to yet other embodiments of the present inventive concept, the first capping layer 150 extends onto the uppermost surface 120u of the first barrier layer, but the present disclosure is not limited thereto. The first capping layer 150 extends onto the top surface 140t of the first metal wire and the uppermost surface 130u of the first liner layer 130 and may not extend onto the uppermost surface 120u of the first barrier layer, of course.

In FIG. 6, because the first capping layer 150 is formed even on the uppermost surface 130u of the first liner layer 130 and the uppermost surface 120u of the first barrier layer 120, a part of the first capping layer 150 may protrude above the uppermost surface 130u of the first liner layer 130.

Because the first capping layer 150 extends onto the uppermost surface 120u of the first barrier layer 120, the first capping layer 150 may directly contact the first barrier layer 120. The first barrier layer 120 may be formed along the first liner layer 130, which is formed along the side wall 140s and the bottom surface 140b of the first metal wire. Accordingly, the first capping layer 150 and the first barrier layer 120 may cover the first metal wire 140 and the first liner layer 130 on the whole.

A semiconductor device according to still other embodiments of the present inventive concept will be described with reference to FIG. 7. For easy description, a part duplicated with the embodiments described with respect to FIGS. 1 and 2 will be described in brief or omitted.

Figure 7:
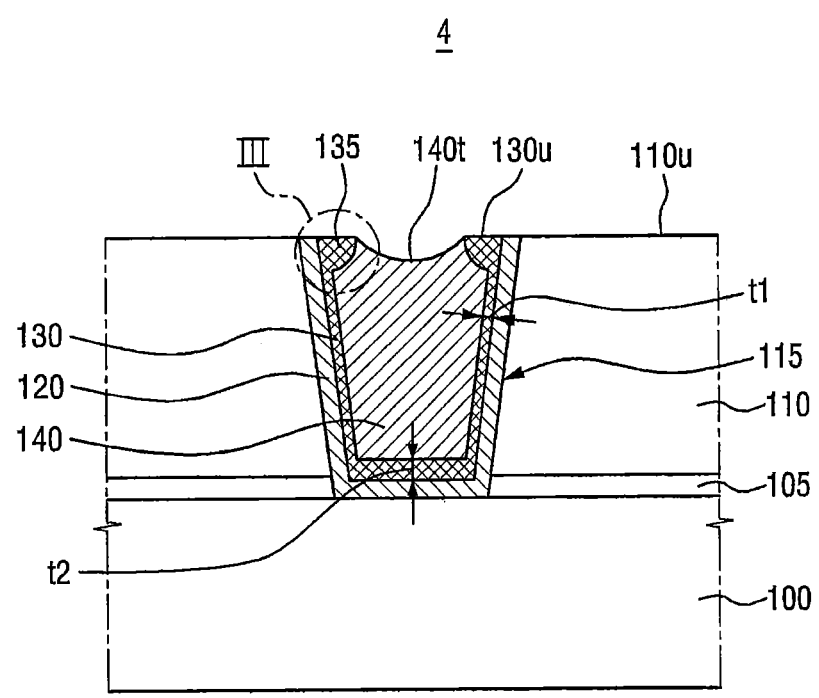
FIG. 7 is a diagram for illustrating a semiconductor device according to still further embodiments of the present inventive concept.

FIG. 7 is a diagram for illustrating a semiconductor device according to still other embodiments of the present inventive concept.

Referring to FIG. 7, in a semiconductor device 4 according to still other embodiments of the present inventive concept, a thickness t2 of the first liner layer 130 formed on the bottom surface of the first trench 115 may be larger than a thickness t1 of the first liner layer 130 formed on the side wall of the first trench 115.

When the first liner layer 130 is formed by using a deposition method in which step-coverage is bad, for example, physical vapor deposition (PVD), the thickness of the first liner layer 130 formed on the bottom surface of the first trench 115 may be larger than the thickness of the first liner layer 130 formed on the side wall of the first trench 115.

At a portion where the top surface 140t of the first metal wire 140 and the uppermost surface 130u of the first liner layer 130 meet, the first liner layer 130 formed on the side wall of the first trench 115 may have an overhang structure 135.

A semiconductor device according to still other embodiments of the present inventive concept will be described with reference to FIGS. 8 to 10. For easy description, a part duplicated with the embodiments described with respect to FIGS. 4 and 5 will be described in brief or omitted.

Figure 8:
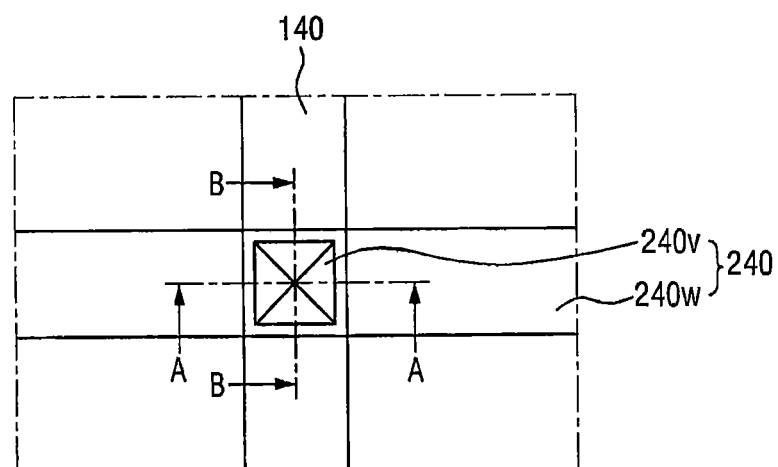
FIG. 8 is a layout view for illustrating a semiconductor device according to still yet another embodiment of the present inventive concept.
Figure 8:
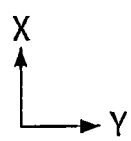

FIG. 8 is a layout diagram for illustrating a semiconductor device according to still yet another embodiment of the present inventive concept. FIG. 9 is a cross-sectional view taken along line A-A of FIG. 8. FIG. 10 is a cross-sectional view taken along line B-B of FIG. 8.

Figure 9:
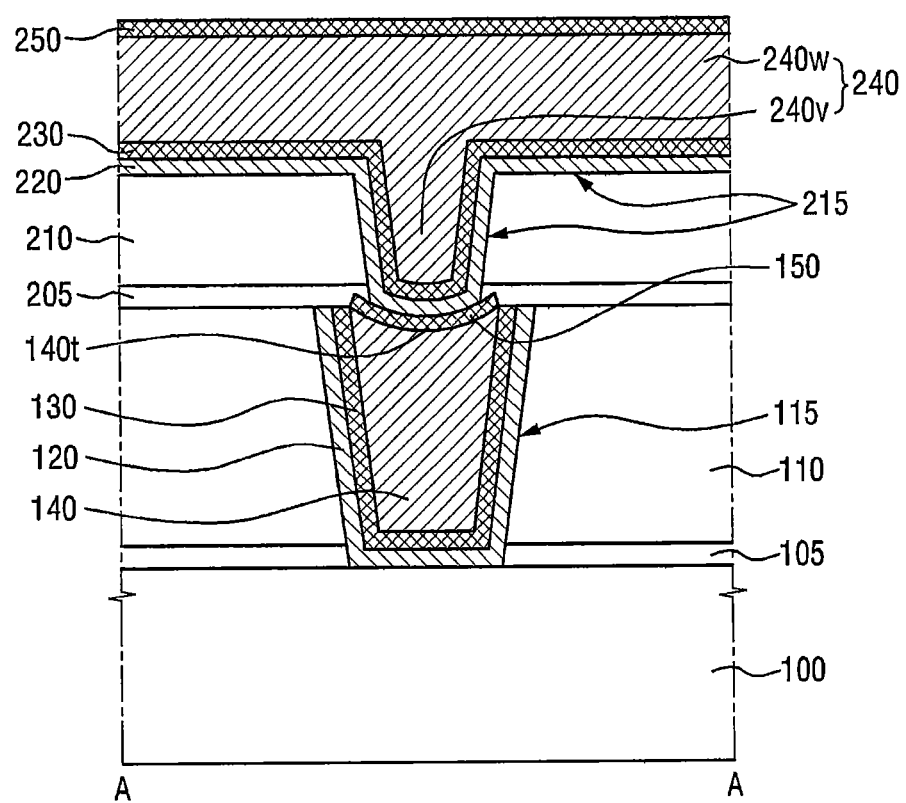
FIG. 9 is a cross-sectional view taken along line A-A of FIG. 8.
Figure 10:
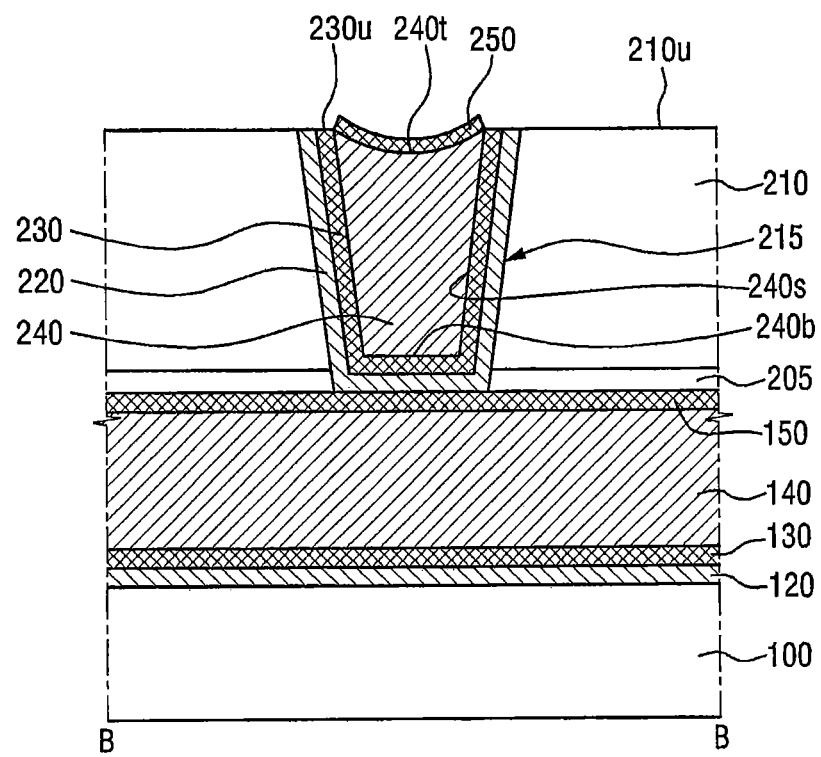
FIG. 10 is a cross-sectional view taken along line B-B of FIG. 8.

Referring to FIGS. 8 to 10, a semiconductor device 5 according to still other embodiments of the present inventive concept may further include a second interlayer insulating layer 210, a second barrier layer 220, a second liner layer 230, a second metal wire 240, a second capping layer 250, and the like.

The second interlayer insulating layer 210 may be formed on the first interlayer insulating layer 110 and the first metal wire 140. The second interlayer insulating layer 210 may include a second trench 215 formed in the second interlayer insulating layer 210.

A second etch stop layer 205 that protects the first metal wire 140 may be further included between the first interlayer insulating layer 110 and the second interlayer insulating layer 210. The second trench 215 may extend up to the second etch stop layer 205.

In the semiconductor device 5 according to still other embodiments of the present inventive concept, the second trench 215 may expose the first capping layer 150 positioned below the second interlayer insulating layer 210.

The second etch stop layer 205 is formed on the first interlayer insulating layer 110. The second etch stop layer 205 may include, for example, silicon nitride, silicon oxynitride, silicon carbon nitride, and the like.

The second interlayer insulating layer 210 may include, for example, at least one of silicon oxide, silicon nitride, silicon oxynitride, and the low dielectric constant material. The second interlayer insulating layer 210 may include a low-dielectric material to reduce the coupling phenomenon between the wires, like the first interlayer insulating layer 110.

The second barrier layer 220 may be formed along a side wall and a bottom surface of the second trench 215. In the semiconductor device 5 according to still other embodiments of the present inventive concept, the second barrier layer 220 may be formed along a profile of the first capping layer 150 exposed by the second trench 215. The second barrier layer 220 may directly contact the first capping layer 150, but may not directly contact the first metal wire 140.

The second barrier layer 220 may include, for example, one of titanium (Ti), titanium nitride (TiN), tantalum (Ta), tantalum nitride (TaN), tantalum carbon nitride (TaCN), tungsten (W), tungsten nitride (WN), tungsten carbon nitride (WCN), zirconium (Zr), zirconium nitride (ZrN), vanadium (V), vanadium nitride (VN), niobium (Nb), niobium nitride (NbN), and combinations thereof.

The second liner layer 230 may be formed along the side wall and the bottom surface of the second trench 215. The second liner layer 230 may be formed on the second barrier layer 220. That is, the second barrier layer 220 may be formed between the second liner layer 230 and the second interlayer insulating layer 210.

The second liner layer 230 may include a noble metal, which has resistance to corrosion and oxidation under a humid environment. For example, the second liner layer 230 belongs to the eighth group to the tenth group, in the periodic chart that follows IUPAC numbering of International Union of Pure and Applied Chemistry (IUPAC) and may be a noble metal that belongs to the fifth period and/or the sixth period.

In detail, the second liner layer 230 may include, for example, at least one of ruthenium (Ru), platinum (Pt), iridium (Ir), and rhodium (Rh).

For example, the first metal wire 140 may extend in a first direction X and the second metal wire 240 may extend in a second direction Y. The second metal wire 240 may be formed on the first metal wire 140.

The second metal wire 240 may be formed by filling the second trench 215, in the second trench 215. The second metal wire 240 may be formed on the second liner layer 230.

The second metal wire 240 may include a via portion 240v that contacts the first capping layer 150 and a wire portion 240w that extends in the second direction Y. The wire portion 240w of the second metal wire may be connected with the first metal wire 140 via the via portion 240v of the second metal wire.

In the semiconductor device 5 according to still other embodiments of the present inventive concept, the first capping layer 150, the second barrier layer 220, and the second liner layer 230 may be positioned between a bottom surface of the via portion 240v of the second metal wire and the top surface 140t of the first metal wire.

The second metal wire 240 may include copper (Cu). Further, the copper included in the second metal wire 240 may include, for example, carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), magnesium (Mg), aluminum (Al), or zirconium (Zr).

In the semiconductor device 5 according to still other embodiments of the present inventive concept, a top surface 240t of the second metal wire 240 may be a curved surface having a convex shape toward the bottom surface of the second trench 215. The top surface 240t of the second metal wire 240 may be concave from a top surface of the second interlayer insulating layer 210.

In FIGS. 8 to 10, the top surface 140t of the first metal wire 140 having the convex shape toward the bottom surface of the first trench 115 may extend in the first direction X, and the top surface 240t of the second metal wire 240 having the convex shape toward the bottom surface of the second trench 215 may extend in the second direction Y. That is, the top surface 140t of the first metal wire 140 and the top surface 240t of the second metal wire 240 may have a half-pipe shape.

At a point where the second liner layer 230 and the top surface 240t of the second metal wire 240 are adjacent to each other, an uppermost surface of the second liner layer 230 and the top surface 240t of the second metal wire 240 may be continuous. In other words, at the point where the second liner layer 230 and the top surface 240t of the second metal wire 240 are adjacent to each other, no step may be formed between the uppermost surface of the second liner layer 230 and the top surface 240t of the second metal wire 240.

The second capping layer 250 may be formed on the top surface 240t of the second metal wire 240. The second capping layer 250 may be formed along the top surface 240t of the second metal wire 240.

The second capping layer 250 may directly contact the second metal wire 240 and the second liner layer 230. The second capping layer 250 may cover the top surface 240t of the second metal wire on the whole.

The second capping layer 250 may include, for example, at least one of cobalt (Co), ruthenium (Ru), and manganese (Mn).

The second capping layer 250 may be formed along the top surface 240t of the second metal wire 240, and the second liner layer 230 may be formed along the side wall and the bottom surface of the second metal wire 240. That is, like the case where the first capping layer 150 and the first liner layer 130 covers the first metal wire 140 on the whole, the second capping layer 250 and the second liner layer 230 may cover the second metal wire 240 on the whole.

A semiconductor device according to still other embodiments of the present inventive concept will be described with reference to FIGS. 8, 11, and 12. For easy description, a part duplicated with the embodiments described with reference to FIGS. 9 and 10 will be described in brief or omitted.

Figure 11:
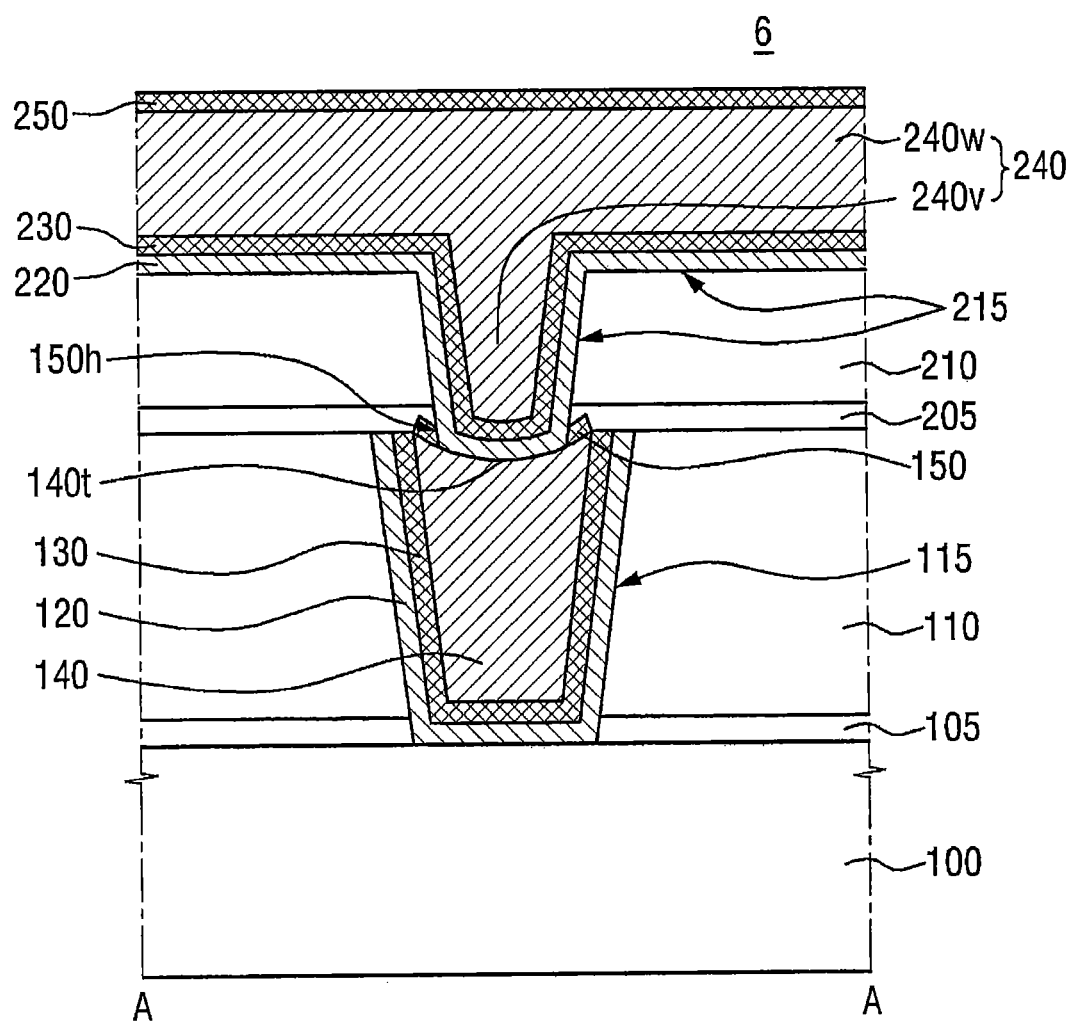
FIGS. 11 and 12 are diagrams for illustrating a semiconductor device according to still further embodiments of the present inventive concept.
Figure 12:
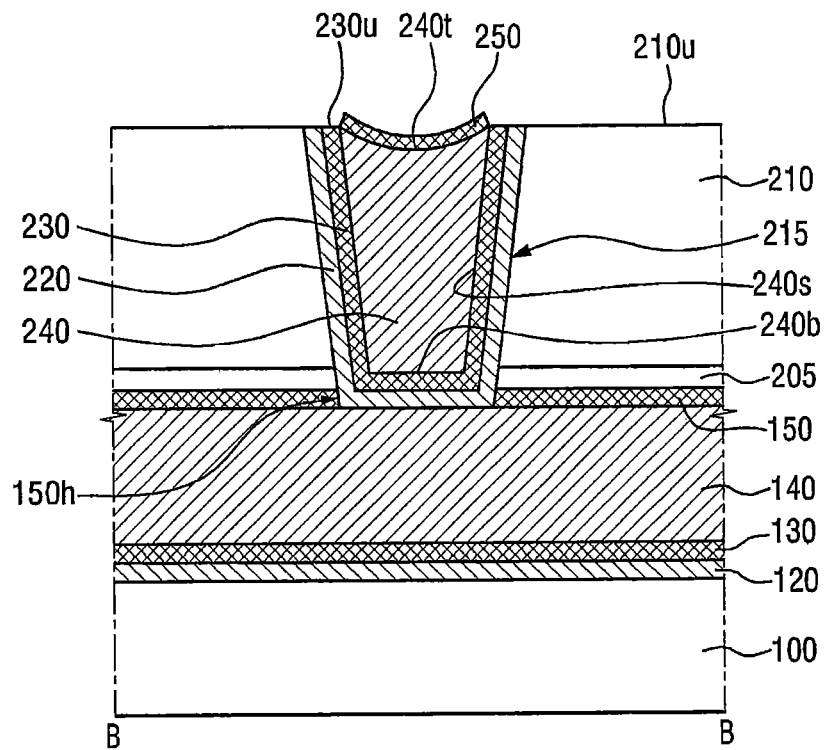

FIGS. 11 and 12 are diagrams for illustrating a method for fabricating a semiconductor device according to still other embodiments of the present inventive concept. For reference, FIG. 11 is a cross-sectional view taken along line A-A of FIG. 8 and FIG. 12 is a cross-sectional view taken along line B-B of FIG. 8.

Referring to FIGS. 11 and 12, in a semiconductor device 6 according to still other embodiments of the present inventive concept, the first capping layer 150 may include an opening 150h that exposes a part of the top surface 140t of the first metal wire 140.

The position of the opening 150h included in the first capping layer 150 may correspond to a position where the via portion 240v of the second metal wire 240 is formed. That is, the first capping layer 150 may cover the top surface 140t of the first metal wire 140 on the whole, except for the position where the via portion 240v of the second metal wire 240 is formed.

Because the top surface 140t of the first metal wire 140 is exposed by the opening 150h, the second barrier layer 220 may directly contact the first metal wire 140. Further, the second barrier layer 220 formed on the bottom surface of the second trench 215 may formed along a profile of the top surface 140t of the first metal wire 140.

In the semiconductor device 6 according to still other embodiments of the present inventive concept, the first capping layer 150 and the first liner layer 130 may cover the first metal wire 140 on the whole, except for the portion exposed by the opening 150h.

A method of fabricating a semiconductor device according to some embodiments of the present inventive concept will be described with reference to FIGS. 1, 4, 13 to 16. The semiconductor device fabricated through the method may be the semiconductor device described with respect to FIG. 4.

FIGS. 13 to 16 are middle-stage diagrams for illustrating a method for fabricating a semiconductor device according to some embodiments of the present inventive concept.

Figure 13:
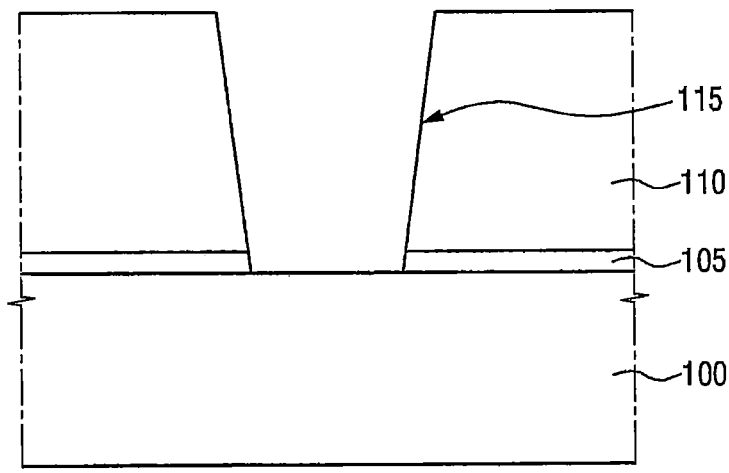
FIGS. 13 to 16 are middle-stage diagrams for illustrating a method of fabricating a semiconductor device according to some embodiments of the present inventive concept.

Referring to FIG. 13, the first etch stop layer 105 and the first interlayer insulating layer 110 are sequentially formed on the substrate 100.

The first etch stop layer 105 may be formed through, for example, chemical vapor deposition (CVD), and the like.

The first interlayer insulating layer 110 may be formed by using, for example, CVD, spin coating, plasma enhanced CVD (PECVD), high density plasma CVD (HDP-CVD), and the like.

Subsequently, the first trench 115 may be formed in the first interlayer insulating layer 110 and the first etch stop layer 105 by etching the first interlayer insulating layer 110 and the first etch stop layer 105 by using a mask pattern and the like. Therefore, the first interlayer insulating layer 110 including the first trench 115 may be formed on the substrate 100.

Figure 14:
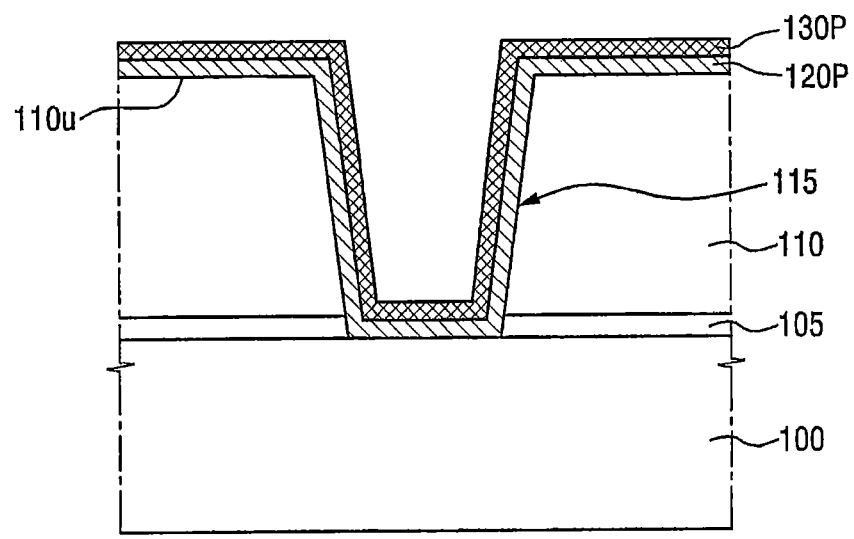

Referring to FIG. 14, a prebarrier layer 120P and a preliner layer 130P may be sequentially formed along the side wall and the bottom surface of the first trench 115 and the top surface 110u of the first interlayer insulating layer.

The prebarrier layer 120P may include, for example, one of titanium (Ti), titanium nitride (TiN), tantalum (Ta), tantalum nitride (TaN), tantalum carbon nitride (TaCN), tungsten (W), tungsten nitride (WN), tungsten carbon nitride (WCN), zirconium (Zr), zirconium nitride (ZrN), vanadium (V), vanadium nitride (VN), niobium (Nb), niobium nitride (NbN), and combinations thereof. The prebarrier layer 120P may be formed by using, for example, methods including PVD, sputtering, CVD, atomic layer deposition (ALD), and the like, but is not limited thereto.

The preliner layer 130P may include, for example, at least one of ruthenium (Ru), platinum (Pt), iridium (Ir), and rhodium (Rh), which are noble metals. The preliner layer 130P may be formed by using, for example, the methods including PVD, CVD, ALD, and the like, but is not limited thereto. In the method of fabricating the semiconductor device according to some embodiments of the present inventive concept, it is described that the preliner layer 130P is formed by using CVD.

Figure 15:
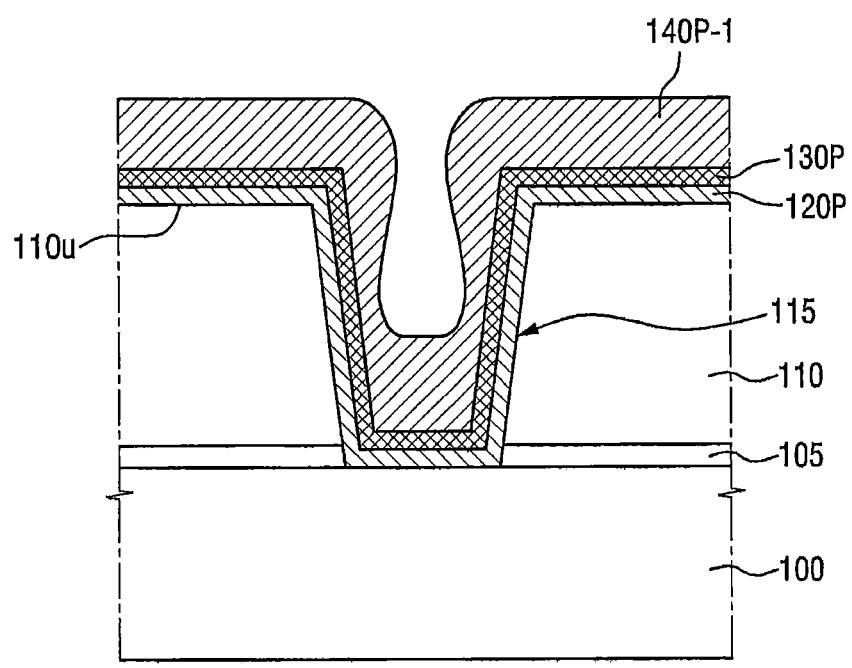

Referring to FIG. 15, a pre-metal layer 140P-1 may be formed on the preliner layer 130P. The pre-metal layer 140P-1 may fill a part of the first trench 115 and be formed on the top surface 110u of the first interlayer insulating layer.

The pre-metal layer 140P-1 may include, for example, copper (Cu). The pre-metal layer 140P-1 may be formed by using a method such as PVD or sputtering, but is not limited thereto.

Figure 16:
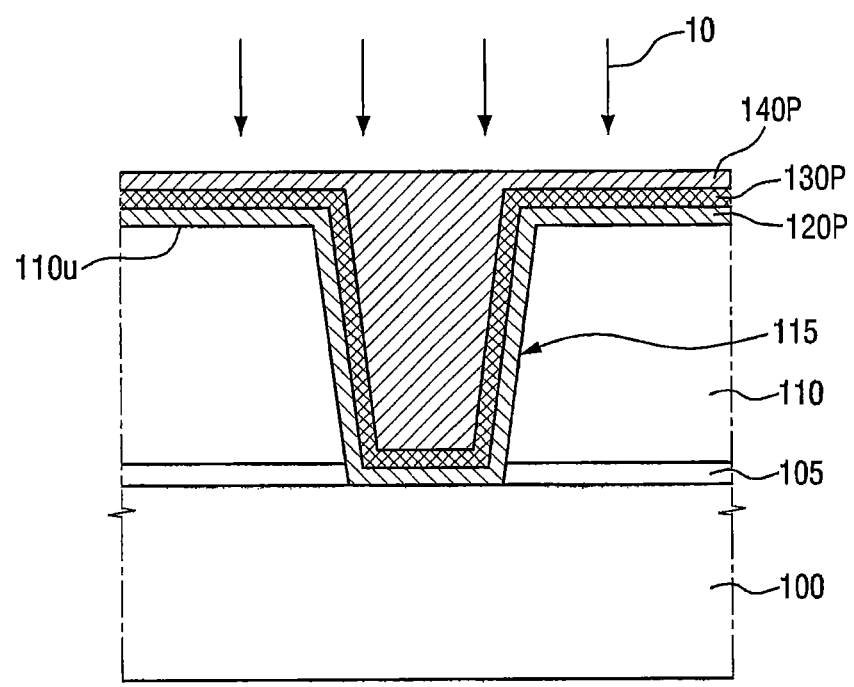

Referring to FIG. 16, the pre-metal layer 140P-1 reflows by using a reflow process 10 to form a metal layer 140P on the preliner layer 130P.

The metal layer 140P may fill the first trench 115. Further, the metal layer 140P may cover the top surface 110u of the first interlayer insulating layer 110.

Referring to FIG. 16, the metal layer 140P, the preliner layer 130P, and the prebarrier layer 120P formed on the top surface 110u of the first interlayer insulating layer 110 may be removed by using a planarization process.

Therefore, the top surface 110u of the first interlayer insulating layer may be exposed. Further, the first barrier layer 120 and the first liner layer 130 may be formed along the side wall and the bottom surface of the first trench 115, and the first metal wire 140 may be formed, which fills the first trench 115.

A planarization process, for example, a chemical mechanical polishing process may be used.

A material included in the preliner layer 130P may be a noble metal and the preliner layer 130P may have chemical resistance by slurry used in the CMP process. That is, the preliner layer 130P may be removed by a chemical polishing operation and a mechanical polishing operation depending on the slurry, but the chemical polishing operation may be limitative.

However, the metal layer 140P may not have a chemical resistance by the slurry used in the CMP process. Accordingly, the metal layer 140P may be removed by the chemical polishing operation and the mechanical polishing operation, and may be removed more rapidly than the preliner layer 130P.

When the CMP process for forming the first metal wire 140P progresses, the top surface 140t of the first metal wire adjacent to the first liner layer 130 is polished less, and the center of the top surface 140t of the first metal wire distant from the first liner layer 130 is polished more.

As a result, the top surface 140t of the first metal wire may have a convex shape toward the bottom surface of the first trench 115. Further, the top surface 140t of the first metal wire and the uppermost surface 130u of the first liner layer are continuous, and no step may be formed between the top surface 140t of the first metal wire and the uppermost surface 130u of the first liner layer 130.

Subsequently, referring to FIG. 4, the first capping layer 150 may be formed on the top surface 140t of the first metal wire.

The first capping layer 150 may be formed by using a method that may selectively deposit the conductive material on the top surface 140t of the first metal wire 140. Accordingly, the first capping layer 150 may not extend onto the top surface 110u of the first interlayer insulating layer 110.

A method of fabricating a semiconductor device according to other embodiments of the present inventive concept will be described with reference to FIGS. 13, 14, 17, and 18.

Figure 17:
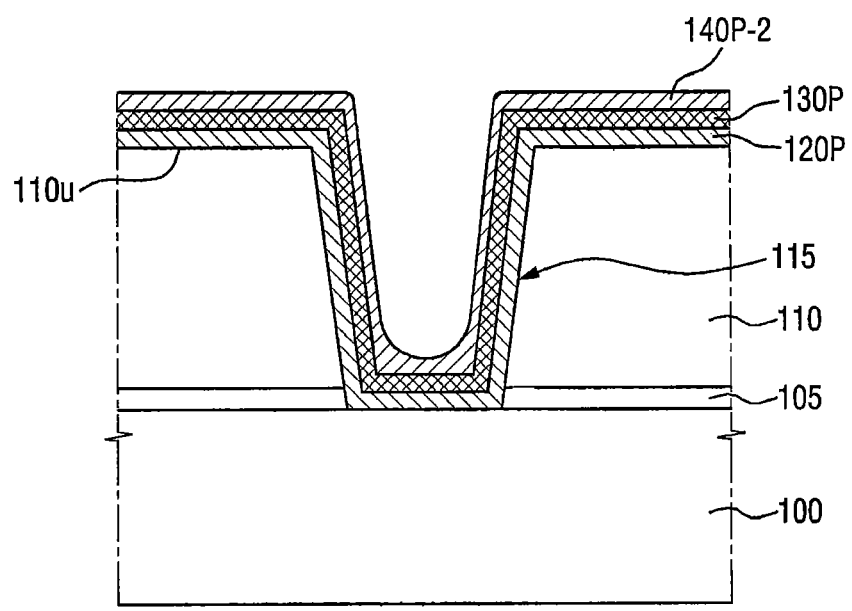
FIGS. 17 and 18 are middle-stage diagrams for illustrating a method of fabricating a semiconductor device according to other embodiments of the present inventive concept.
Figure 18:
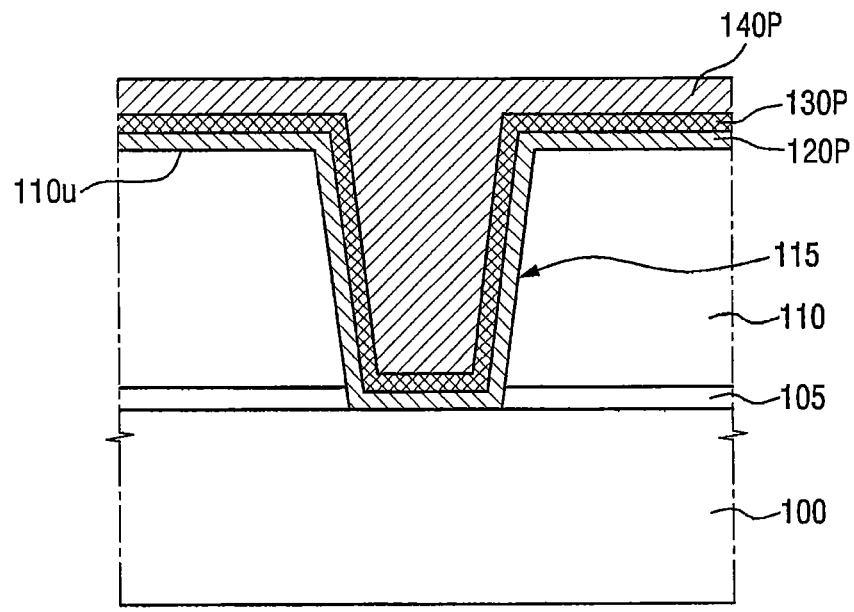

FIGS. 17 and 18 are middle-stage diagrams for illustrating a method of fabricating a semiconductor device according to other embodiments of the present inventive concept.

Referring to FIG. 17, a metal seed layer 140P-2 may be formed on the preliner layer 130P. The metal seed layer 140P-2 may be formed on the side wall and the bottom surface of the first trench 115 and the top surface 110u of the first interlayer insulating layer 110.

The metal seed layer 140P-2 may include, for example, copper (Cu). The metal seed layer 140P-2 may be formed by using the method such as the PVD or the sputtering. Alternatively, the metal seed layer 140P-2 may be formed by being immersed in an electrolyte including copper (Cu) ions.

Referring to FIG. 18, the metal layer 140P may be formed by using an electroplating method.

The metal layer 140P may fill the first trench 115. Further, the metal layer 140P may cover the top surface 110u of the first interlayer insulating layer 110.

Figure 19:
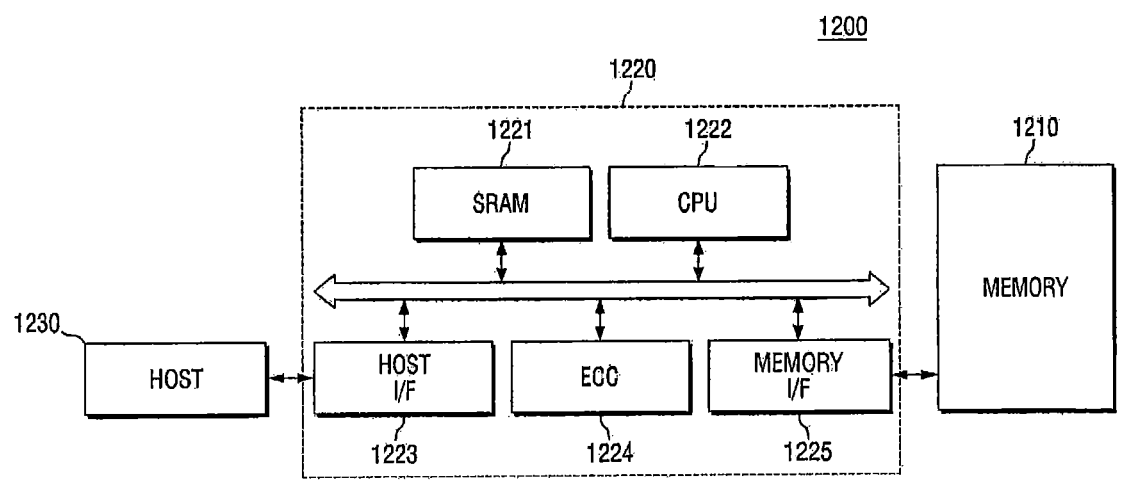
FIG. 19 is a block diagram of a memory card including the semiconductor devices according to some embodiments of the present inventive concept.

FIG. 19 is a block diagram of a memory card including a semiconductor device according to some embodiments of the present inventive concept.

Referring to FIG. 19, a memory 1210 including a semiconductor device according to various embodiments of the present inventive concept may be adopted in a memory card 1200. The memory card 1200 may include a memory controller 1220 that controls data exchange between a host 1230 and the memory 1210. An SRAM 1221 may be used as an operating memory of a central processing unit 1222. A host interface 1223 may include a protocol for the host 1230 to exchange data by accessing the memory card 1200. An error correction code 1224 may detect and correct an error of data read from the memory 1210. The memory interface 1225 may interface with the memory 1210. The central processing unit 1222 may perform an overall control operation associated with the data exchange of the memory controller 1220.

Figure 20:
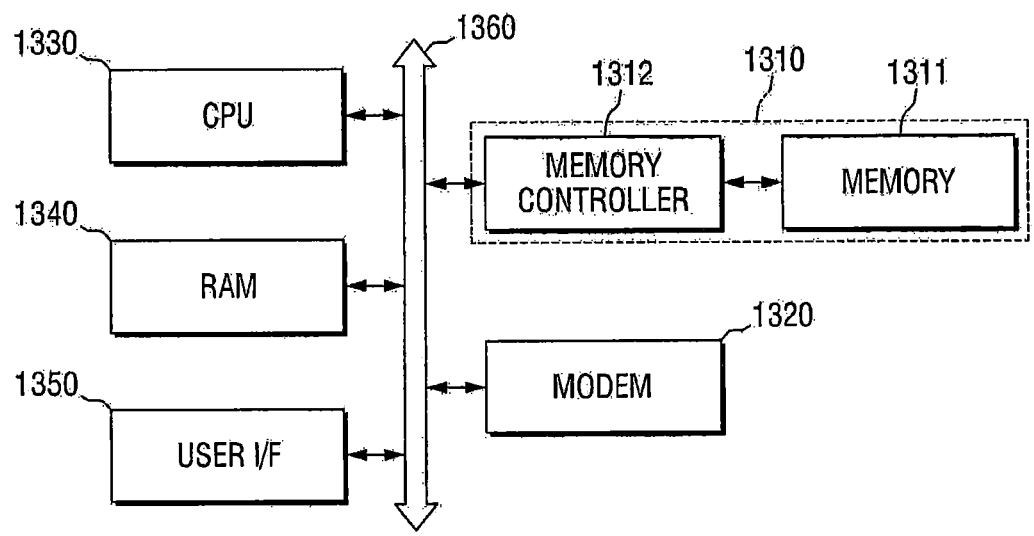
FIG. 20 is a block diagram of an information processing system using the semiconductor devices according to some embodiments of the present inventive concept.

FIG. 20 is a block diagram of an information processing system using a semiconductor device according to some embodiments of the present inventive concept.

Referring to FIG. 20, the information processing system 1300 may include a memory system 1310 including a semiconductor device according to various embodiments of the present inventive concept. The information processing system 1300 may include the memory system 1310, a modem 1320, a central processing unit 1330, a RAM 1340, and a user interface 1350, which are electrically connected with a system bus 1360. The memory system 1310 may include a memory 1311 and a memory controller 1312 and may have the substantially same configuration as the memory card illustrated in FIG. 19. Data processed by the central processing unit 1330 or data received from an external device may be stored in the memory system 1310. The information processing system 1300 may be applied to a memory card, an SSD, a camera image sensor, and various other chipsets. For example, the memory system 1310 may be configured in such a manner that the SSD is adopted, and in this case, the information processing system 1300 may stably and reliably process large-capacity data.

Figure 21:
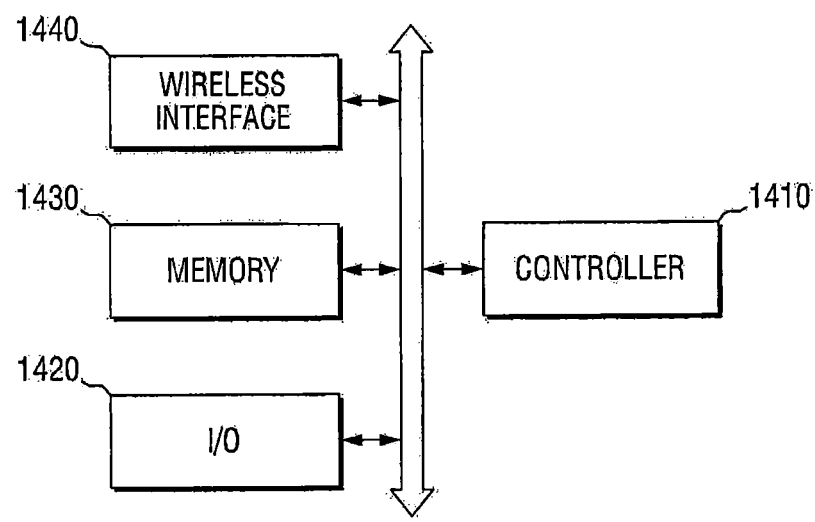
FIG. 21 is a block diagram of an electronic apparatus including semiconductor devices according to some embodiments of the present inventive concept.

FIG. 21 is a block diagram of an electronic apparatus including a semiconductor device according to some embodiments of the present inventive concept.

Referring to FIG. 21, an electronic apparatus 1400 may include a semiconductor device according to various embodiments of the present inventive concept. The electronic apparatus 1400 may be used in wireless communication apparatuses (for example, a PDA, a notebook, a portable computer, a web tablet, a wireless phone, and/or a wireless digital music player) or various apparatuses that transmit and receive information under a wireless communication environment.

The electronic apparatus 1400 may include a controller 1410, an input/output device 1420, a memory 1430, and a wireless interface 1440. Herein, the memory 1430 may include a semiconductor device according to various embodiments of the present inventive concept. The controller 1410 may include a microprocessor, a digital signal processor, or a processor similar thereto. The memory 1430 may be used to store commands (alternatively, user data) processed by the controller 1410. The wireless interface 1440 may be used to transmit and receive data through a wireless data network. The wireless interface 1440 may include an antenna and/or a wireless transceiver. The electronic apparatus 1400 may use 3rd-generation communication system protocols such as CDMA, GSM, NADC, E-TDMA, WCDMA, and CDMA 2000.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A method of fabricating a semiconductor device, the method comprising:
    forming an interlayer insulating layer including a trench;
    forming a prebarrier layer and a preliner layer sequentially along a side wall and a bottom surface of the trench, and a top surface of the interlayer insulating layer, the preliner layer includes ruthenium;
    forming a metal layer in the trench and on the top surface of the interlayer insulating layer and the preliner layer;
    forming a barrier layer, a liner layer, and a metal wire in the trench by removing the metal layer, the preliner layer, and the prebarrier layer on the top surface of the interlayer insulating layer by using a planarization process; and
    forming a capping layer on a top surface of the metal wire, the capping layer completely overlapping the top surface of the metal wire without extending onto a top surface of the barrier layer,
    wherein the top surface of the metal wire has a convex shape toward the bottom surface of the trench,
    wherein the planarization process includes a CMP process using a slurry, and
    wherein the preliner layer has a stronger chemical resistance to the slurry than the metal layer.

2. The method of claim 1, wherein the preliner layer is formed by using chemical vapor deposition.

3. The method of claim 1, at a point where the liner layer and the top surface of the metal wire are adjacent to each other, an uppermost surface of the preliner layer and the top surface of the metal wire are continuous.

4. The method of claim 3, wherein at the point where the liner layer and the top surface of the metal wire are adjacent to each other, no step is formed between the uppermost surface of the preliner layer and the top surface of the metal wire.

5. The method of claim 3, wherein the uppermost surface of the liner layer and the top surface of the metal wire directly contact each other.

6. The method of claim 3, wherein the top surface of the metal wire does not protrude above the uppermost surface of the liner layer on the whole.

7. The method of claim 1, wherein the capping layer is formed by selectively depositing a layer on the top surface of the metal wire, and
    wherein the capping layer does not extend onto the top surface of the interlayer insulating layer.

8. The method of claim 1, wherein the capping layer comprises at least one of cobalt (Co), ruthenium (Ru), and manganese (Mn).

9. The method of claim 1, wherein the forming of the metal layer comprises:
    forming a pre-metal layer on the top surface of the interlayer insulating layer and in the trench, and
    reflowing the pre-metal layer.

10. The method of claim 1, wherein the metal layer is formed by using an electroplating method.

11. The method of claim 1, further comprising forming an upper interlayer insulating layer on the interlayer insulating layer, the upper interlayer insulating layer including an upper trench,
    wherein the capping layer is formed prior to forming the upper interlayer insulating layer, and
    wherein the upper trench exposes the capping layer.

12. A method of fabricating a semiconductor device, the method comprising:
    forming an interlayer insulating layer including a trench;
    forming a prebarrier layer and a preliner layer sequentially along a side wall and a bottom surface of the trench, and a top surface of the interlayer insulating layer, wherein the preliner layer includes noble metal, the noble metal belonging to one of a fifth period and a sixth period of a periodic chart that follows numbering of International Union of Pure and Applied Chemistry (IUPAC) and belonging to one of eighth to tenth groups of the periodic chart;
    forming a metal layer in the trench and on the top surface of the interlayer insulating layer and the preliner layer;
    performing a CMP process to remove the metal layer, the preliner layer, and the prebarrier layer on the top surface of the interlayer insulating layer and to form a barrier layer, a liner layer, and a metal wire in the trench; and
    forming a capping layer on a top surface of the metal wire, the capping layer completely overlapping the top surface of the metal wire without extending onto a top surface of the barrier layer,
    wherein the CMP process removes the metal layer faster than the preliner layer.

13. The method of claim 12, wherein the noble metal includes at least one of ruthenium (Ru), platinum (Pt), iridium (Ir), and rhodium (Rh).

14. The method of claim 12, wherein the CMP process includes a chemical polishing operation and a mechanical polishing operation, and
    wherein the chemical polishing operation removes the metal layer faster than the preliner layer.

15. The method of claim 14, wherein the CMP process uses a slurry, and
    the preliner layer has a stronger chemical resistance to the slurry than the metal layer.

16. The method of claim 12, wherein after the performing the CMP process, the top surface of the metal wire has a convex shape toward the bottom surface of the trench.

17. The method of claim 12, wherein forming the capping layer comprises:
    selectively depositing the capping layer on the top surface of the metal wire,
    wherein the capping layer does not extend onto the top surface of the interlayer insulating layer.

18. The method of claim 12, wherein the capping layer comprises at least one of cobalt (Co), ruthenium (Ru), and manganese (Mn).

19. The method of claim 12, further comprising forming an upper interlayer insulating layer on the interlayer insulating layer, the upper interlayer insulating layer including an upper trench,
- wherein the capping layer is formed prior to forming the upper interlayer insulating layer, and
- wherein the upper trench exposes the capping layer.

* * * * *